US009437731B2

(12) United States Patent
Park

(10) Patent No.: US 9,437,731 B2
(45) Date of Patent: Sep. 6, 2016

(54) SEMICONDUCTOR DEVICE HAVING VERTICAL CHANNEL, RESISTIVE MEMORY DEVICE INCLUDING THE SAME, AND METHOD OF MANUFACTURING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/508,584

(22) Filed: Oct. 7, 2014

(65) Prior Publication Data
US 2015/0372135 A1 Dec. 24, 2015

(30) Foreign Application Priority Data
Jun. 24, 2014 (KR) ......................... 10-2014-0077495

(51) Int. Cl.
| H01L 29/78 | (2006.01) |
| H01L 29/66 | (2006.01) |
| H01L 27/24 | (2006.01) |
| H01L 27/22 | (2006.01) |

(52) U.S. Cl.
CPC ..... *H01L 29/7827* (2013.01); *H01L 29/66666* (2013.01); *H01L 27/228* (2013.01); *H01L 27/2454* (2013.01)

(58) Field of Classification Search
None
See application file for complete search history.

(56) References Cited

U.S. PATENT DOCUMENTS

| 7,205,604 | B2* | 4/2007 | Ouyang | H01L 29/1054 257/302 |
| 7,977,736 | B2* | 7/2011 | Kim | H01L 21/823842 257/328 |
| 8,063,450 | B2* | 11/2011 | Wernersson | B82Y 10/00 257/213 |
| 2009/0166725 | A1* | 7/2009 | Lee | H01L 29/7827 257/329 |
| 2010/0207201 | A1* | 8/2010 | Masuoka | H01L 27/0207 257/329 |
| 2010/0213539 | A1* | 8/2010 | Masuoka | H01L 21/84 257/329 |
| 2013/0015500 | A1* | 1/2013 | Izumida | H01L 29/42368 257/192 |
| 2014/0166981 | A1* | 6/2014 | Doyle | H01L 29/66666 257/24 |

FOREIGN PATENT DOCUMENTS

KR 1020090074504 7/2009

* cited by examiner

*Primary Examiner* — Michael Lebentritt
*Assistant Examiner* — Jordan Klein
(74) *Attorney, Agent, or Firm* — IP & T Group LLP

(57) ABSTRACT

A semiconductor device includes a semiconductor substrate having a first conductivity type, a plurality of pillars extending to a direction perpendicular to a surface of the semiconductor substrate, a stress providing layer formed in the semiconductor substrate between pillars and forming a junction with the semiconductor substrate below each pillar to cause lattice deformation in the pillar, a source region having a second conductivity type opposite to the first conductivity type formed in the semiconductor substrate below the pillar, a drain region having the second conductivity type formed in an upper portion of the pillar, a gate insulating layer formed on a lateral surface of the pillar and a surface of the stress providing layer, and a gate electrode formed to surround the lateral surface of the pillar.

8 Claims, 5 Drawing Sheets

SEMICONDUCTOR DEVICE HAVING VERTICAL CHANNEL, RESISTIVE MEMORY DEVICE INCLUDING THE SAME, AND METHOD OF MANUFACTURING THE SAME

CROSS-REFERENCES TO RELATED APPLICATION

This application claims priority under 35 U.S.C. 119(a) to Korean application No. 10-2014-0077495, filed on Jun. 24, 2014, in the Korean intellectual property Office, which is incorporated by reference in its entirety as set forth in full.

BACKGROUND

1. Technical Field

Embodiments relate to a semiconductor integrated circuit device and a method of manufacturing the same, and more particularly, to a semiconductor device having a vertical channel, a resistive memory device including the same, and a method of manufacturing the same.

2. Related Art

With rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with large capacity, ultra-high speed, and ultra-low power consumption need to be developed to satisfy demands on large capacity memories serving as main information apparatuses.

Currently, resistive memory devices using a variable resistance material as a memory medium have been suggested as the next-generation memory devices. Typical examples of the resistive memory device are phase-change random access memories (PCRAMs), resistive RAMs (ReRAMs), and magneto-resistive RAMs (MRAMs).

Each of the resistive memory devices may include a switching device and a resistive device, and store data "0" or "1" according to the state of the resistive device.

Even in the resistive memory devices, the first priority is to improve integration density and to integrate more memory cells in a limited and small area.

To satisfy these requirements, the resistive memory devices may also employ a three-dimensional (3D) transistor structure. The 3D transistors may include a channel extending to a direction perpendicular to a surface of a semiconductor substrate and a surrounded gate surrounding the channel.

The 3D transistors may require high operation current to maintain high resistance variable characteristics.

SUMMARY

According to an embodiment, there is provided a semiconductor device. The semiconductor device may include a semiconductor substrate having a first conductivity type, a pillar extending from the semiconductor substrate in a direction perpendicular to a surface of the semiconductor substrate, a stress providing layer formed over a lower side wall of the pillar, wherein the stress providing layer is suitable to cause lattice deformation in the pillar, a source region having a second conductivity type opposite to the first conductivity type and formed in the semiconductor substrate under the pillar, a drain region having the second conductivity type formed in an upper portion of the pillar, a gate insulating layer formed on a lateral surface of the pillar and a surface of the stress providing layer, and a gate electrode formed to surround the lateral surface of the pillar.

According to an embodiment, there is provided a method of manufacturing a semiconductor device. The method may include forming a plurality of pillars in a semiconductor substrate having a first conductivity type, forming a recess region by etching a portion of the semiconductor substrate between pillars, forming a stress providing layer in the recess region, forming a gate insulating layer on a surface of the semiconductor substrate, a lateral surface of each pillar, and a surface of the stress providing layer, forming a source region in the semiconductor substrate below the pillar using an impurity having a second conductivity type opposite to the first conductivity type, forming a drain region in an upper portion of the pillar using the impurity having the second conductivity type, and forming a gate electrode on a circumference of the pillar.

According to an embodiment, there provided a semiconductor device. The semiconductor device may include a pillar containing P-type impurities, a stress providing layer formed in a lateral portion of the pillar and forming a junction with a lower portion of the pillar, and an N-type channel formed inside of the pillar. The stress providing layer may be configured to provide tensile stress to the pillar in which the channel is formed.

According to an embodiment, there is provided a resistive memory device. The resistive memory device may include a P-type semiconductor substrate including an N-type source region, a plurality of pillars extending to a direction perpendicular to a surface of the semiconductor substrate from the surface of the semiconductor substrate, a stress providing layer formed in the semiconductor substrate between adjacent pillars and configured to provide tensile stress to each pillar, a drain region formed in an upper portion of the pillar, a gate electrode configured to surround the pillar, a heating electrode formed on the drain region, and a variable resistance layer formed on the heating electrode.

These and other features, aspects and embodiments are described below in the section entitled "DETAILED DESCRIPTION".

BRIEF DESCRIPTION OF THE DRAWINGS

Embodiments will be more clearly understood from the following detailed description taken in conjunction with accompanying drawings, in which.

DETAILED DESCRIPTION

Figure 1:
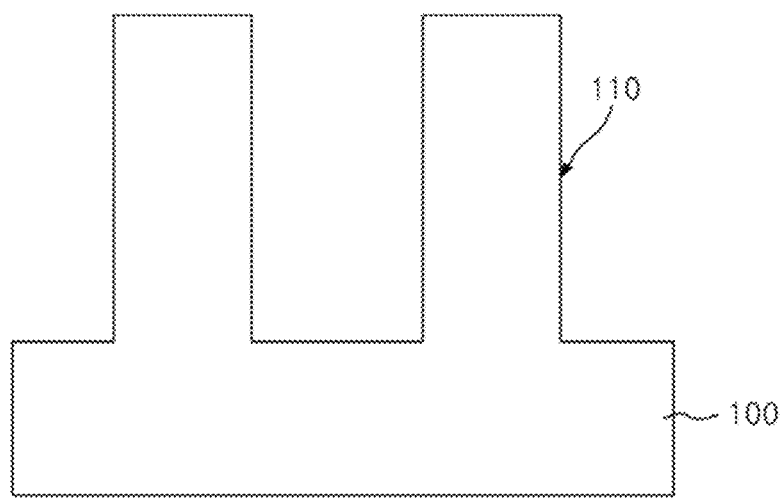
FIG. 1 is cross-sectional view illustrating a method of manufacturing a semiconductor device having a vertical channel according to an embodiment.

Hereinafter exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations, for example, depending on manufacturing techniques and/or tolerances, are to be expected. Thus, exemplary embodiments should not be construed as limited to the particular shapes of regions illustrated herein but may include deviations in shapes. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Embodiments are described herein with reference to cross-section and/or plan illustrations. However, embodiments should not be construed as limiting.

Referring to FIG. 1, a semiconductor substrate 100 is prepared. The semiconductor substrate 100 may be, for example, a silicon (Si) substrate containing first conductivity type impurities such as P type impurities. A predetermined portion of the semiconductor substrate 100 may be etched to form a pillar region 110. The pillar region 110 may be used for a channel layer of a transistor.

Figure 2:
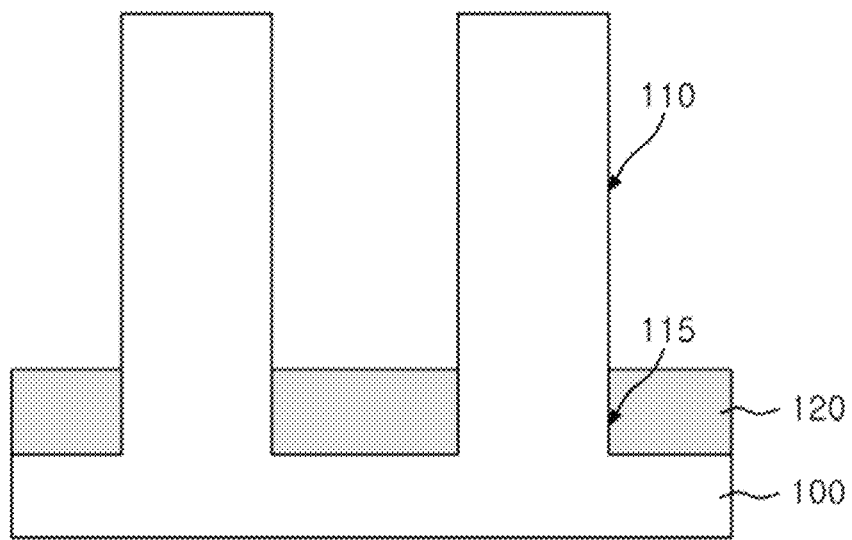
FIG. 2 is cross-sectional view illustrating a method of manufacturing a semiconductor device having a vertical channel according to an embodiment.

Referring to FIG. 2, a semiconductor substrate 100 exposed between pillar regions 110 is recessed by a predetermined depth to form a recess region 115. A stress providing layer 120 may be formed in the recess region 115. The stress providing layer 120 may be a layer for providing tensile stress to the pillar region 110 used for a channel region. The stress providing layer 120 may be formed of a semiconductor material layer having a smaller lattice constant than a silicon material forming the semiconductor substrate 100, for example, a silicon carbide (SiC). The stress providing layer 120 may be formed through a process of forming the semiconductor material layer to sufficiently bury the recess region 115 and a process of planarizing the semiconductor material layer to substantially have the same surface level as the semiconductor substrate.

Figure 3:
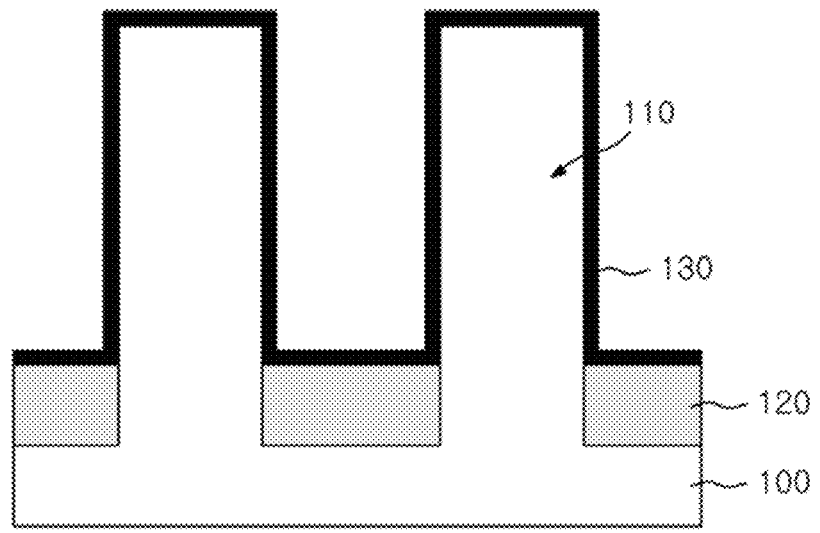
FIG. 3 is cross-sectional view illustrating a method of manufacturing a semiconductor device having a vertical channel according to an embodiment.

Referring to FIG. 3, a gate insulating layer 130 is formed on the surface of the semiconductor substrate 110. The gate insulating layer 130 may be formed, for example, through an oxidation process.

Figure 4:
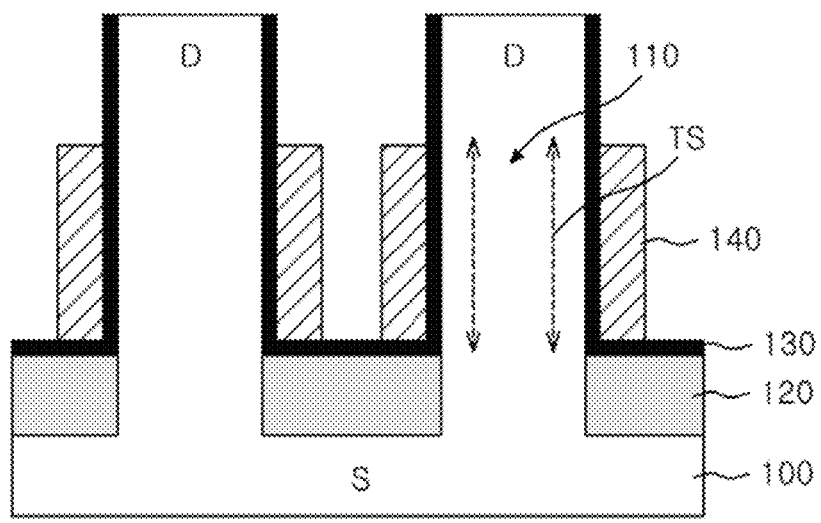
FIG. 4 is cross-sectional view illustrating a method of manufacturing a semiconductor device having a vertical channel according to an embodiment.

Referring to FIG. 4, the gate insulating layer 130 on an upper surface of the pillar region 110 may be selectively removed. A common source region S is formed by implanting second conductivity type impurities, for example, N-type impurities into the semiconductor substrate 100 below the pillar region 110 so that the common source region S extends between neighboring pillar regions 110. That is, each of the common source regions S may be formed to be mutually coupled in the semiconductor substrate 100.

Subsequently, a drain region D may be formed by implanting second conductivity type impurities into an upper portion of the pillar region 110. The drain region D may be formed, for example, in a lightly doped drain (LDD) manner. A surrounding gate electrode 140 may be formed over a sidewall of the pillar region 110. A top of the surrounding gate electrode 140 may be formed lower than a top of the pillar region 110. Further, the surrounding gate electrode 140 may be formed of a doped polysilicon layer or a transition metal layer.

The stress providing layer 120 is formed over a lower sidewall of the pillar region 110. The pillar region 110 under the stress providing layer 120 corresponds to a channel region. As the stress providing layer 120 has a smaller lattice constant than the pillar region 110, lattice deformation may occur when the stress providing layer 120 forms a junction with the pillar region 110. In addition to silicon material included in the pillar region 110, silicon material included in the semiconductor substrate 100 also forms a junction with the stress providing layer 120. Due to differences in lattice size between the pillar region 110 and the stress providing layer 120 or between the substrate 100 and the stress providing layer 120, tensile stress TS is applied to the pillar region 110. When the tensile stress TS is applied to the channel region of the pillar region 110, carrier mobility in the channel may increase significantly.

Figure 5:
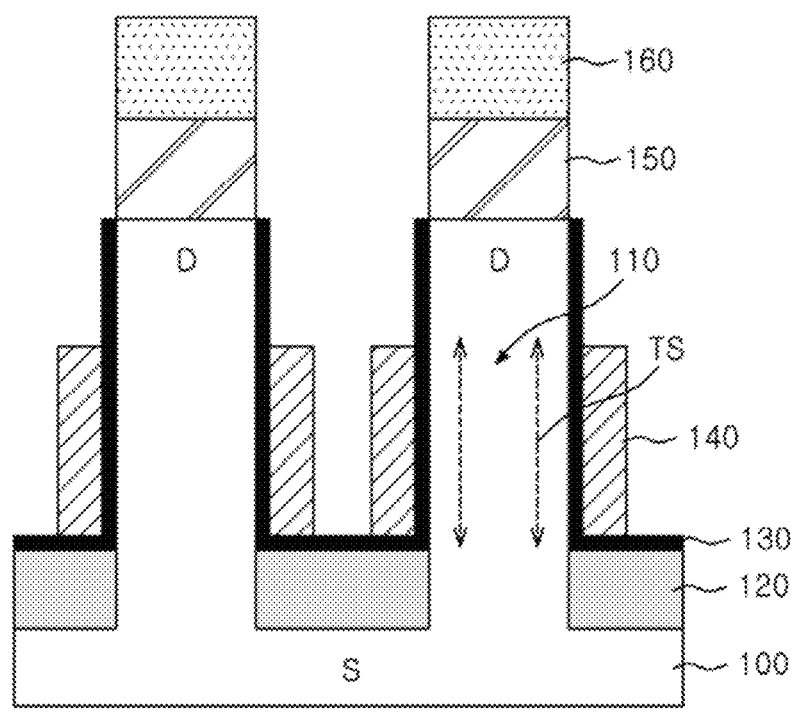
FIG. 5 is a cross-sectional view illustrating a resistive memory device including a semiconductor device having a vertical channel according to an embodiment.

Referring to FIG. 5, a heating electrode 150 and a variable resistance layer 160 are formed on the drain region D, and thus the resistive memory device is substantially completed.

According to an embodiment, a semiconductor layer having a smaller lattice constant than a silicon material forming a pillar region is formed in a lower sidewall of the pillar region so that tensile stress is applied to the pillar region. Therefore, channel mobility of a transistor may be considerably increased.

The above embodiments are illustrative and not limitative. Various alternatives and modification are possible.

What is claimed is:

1. A method of manufacturing a semiconductor device, the method comprising:
   forming first and second pillars each vertically extending from a semiconductor substrate and each having a first conductivity type;
   forming a recess region by etching the semiconductor substrate between the first and the second pillars;
   forming a stress providing layer in the recess region;
   forming a gate insulating layer extending from over a sidewall of the first pillar, over the stress providing layer to over a sidewall of the second pillar;
   forming a source region in the semiconductor substrate, wherein the source region extends from under the first pillar, under the stress providing layer to under the second pillar by using an impurity having a second conductivity type opposite to the first conductivity type;
   forming a drain region in upper portions of the first and the second pillars using the impurity having the second conductivity type;
   forming a first gate electrode over the gate insulating layer to surround the first pillar; and
   forming a second gate electrode over the gate insulating layer to surround the second pillar.

2. The method of claim 1, wherein the first conductivity type is a P-type, and the second conductivity type is an N-type.

3. The method of claim 1, wherein the forming of the stress providing layer includes:
   forming a semiconductor material layer having a smaller lattice constant than each of the first and the second pillars in the recess region; and
   planarizing the semiconductor material layer to be flush with the semiconductor substrate.

4. The semiconductor device of claim 3, wherein each of the first and the second pillars includes silicon (Si), and the stress providing layer includes silicon carbide (SiC).

5. A resistive memory device, comprising:
   a P-type semiconductor substrate including an N-type source region;
   two pillars located adjacent to each other and each extending from a surface of the P-type semiconductor substrate in a direction perpendicular to the surface of the P-type semiconductor substrate;

a stress providing layer formed in the P-type semiconductor substrate and between the two pillars, wherein the stress providing layer is suitable to provide tensile stress to each of the two pillars;

a drain region formed in an upper portion of each of the two pillars;

a gate electrode configured to surround each of the two pillars;

a heating electrode formed over the drain region; and a variable resistance layer formed over the heating electrode.

6. The resistive memory device of claim 5, wherein the stress providing layer includes a semiconductor material and has a smaller lattice constant than each of the two pillars, wherein the stress providing layer and the semiconductor substrate below the pillar form a junction, and wherein the stress providing layer is suitable to cause lattice deformation in each of the two pillars.

7. The resistive memory device of claim 6, wherein the each of the two pillars includes (Si), and the stress providing layer includes silicon carbide (SiC).

8. The resistive memory device of claim 5, wherein the stress providing layer extends from over the lower sidewall of one of the plurality of pillars to over a sidewall of another one of the plurality of pillars.

* * * * *